United States Patent
Okuyama et al.

(10) Patent No.: US 11,657,059 B2
(45) Date of Patent: May 23, 2023

(54) SEARCH DEVICE, SEARCHING METHOD, AND PLASMA PROCESSING APPARATUS

(71) Applicant: HITACHI HIGH-TECH CORPORATION, Tokyo (JP)

(72) Inventors: Yutaka Okuyama, Tokyo (JP); Takeshi Ohmori, Tokyo (JP); Masaru Kurihara, Tokyo (JP); Hyakka Nakada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 253 days.

(21) Appl. No.: 16/284,879

(22) Filed: Feb. 25, 2019

(65) Prior Publication Data

US 2019/0286632 A1    Sep. 19, 2019

(30) Foreign Application Priority Data

Mar. 14, 2018    (JP) .............................. JP2018-046238

(51) Int. Cl.
*H01J 37/32* (2006.01)
*G06F 16/2458* (2019.01)
(Continued)

(52) U.S. Cl.
CPC ........... *G06F 16/2462* (2019.01); *G06N 5/04* (2013.01); *G06N 20/00* (2019.01);
(Continued)

(58) Field of Classification Search
CPC ............ H01L 21/67276; H01J 37/3211; H01J 16/2462; H01J 2237/334; H01J 2237/327;
(Continued)

(56) References Cited

U.S. PATENT DOCUMENTS

| 5,473,532 A | 12/1995 | Unno et al. |
| 5,993,050 A | 11/1999 | Miura |

(Continued)

FOREIGN PATENT DOCUMENTS

| CN | 1098502 C | 1/2003 |
| CN | 1720490 A | 1/2016 |

(Continued)

OTHER PUBLICATIONS

Office Action dated Apr. 6, 2020 in corresponding Taiwanese Application No. 108103411.

(Continued)

*Primary Examiner* — Yuechuan Yu
(74) *Attorney, Agent, or Firm* — Miles & Stockbridge, P.C.

(57) ABSTRACT

A model learning unit learns a prediction model on the basis of learning data, a target setting unit sets a target output parameter value by interpolating between a goal output parameter value and an output parameter value which is the closest to the goal output parameter value in output parameter values in the learning data, a processing condition search unit estimates input parameter values which corresponds to the goal output parameter value and the target output parameter value, a model learning unit updates the prediction model by using a set of the estimated input parameter value and an output parameter value which is a result of processing that a processing device performs as additional learning data.

5 Claims, 10 Drawing Sheets

(51) Int. Cl.
  *H01L 21/67*     (2006.01)
  *G06N 5/04*      (2023.01)
  *G06N 20/00*     (2019.01)

(52) U.S. Cl.
  CPC .... *H01J 37/3211* (2013.01); *H01L 21/67276* (2013.01); *H01J 2237/327* (2013.01); *H01J 2237/334* (2013.01)

(58) Field of Classification Search
  CPC .......... G06N 20/10; G06N 20/00; G06N 5/04; G06F 16/2462
  See application file for complete search history.

(56) References Cited

U.S. PATENT DOCUMENTS

| | | |
|---|---|---|
| 2003/0010914 A1 | 1/2003 | Takane et al. |
| 2003/0140039 A1 | 7/2003 | Ferguson et al. |
| 2008/0021571 A1 | 1/2008 | Kokotov et al. |
| 2008/0279434 A1 | 11/2008 | Cassill |
| 2011/0131162 A1 | 6/2011 | Kaushal et al. |
| 2014/0222376 A1 | 8/2014 | Kao et al. |
| 2015/0161520 A1 | 6/2015 | Kaushal et al. |
| 2017/0018403 A1 | 1/2017 | Koronel |
| 2017/0153611 A1 | 6/2017 | Fujii et al. |
| 2017/0255177 A1 | 9/2017 | Tokuda et al. |
| 2019/0064751 A1 | 2/2019 | Ohmori et al. |
| 2019/0073588 A1 | 3/2019 | Kawaguchi |
| 2019/0122078 A1 | 4/2019 | Ura |
| 2019/0295827 A1 | 9/2019 | Ohmori et al. |

FOREIGN PATENT DOCUMENTS

| | | |
|---|---|---|
| JP | H10-86039 A | 4/1998 |
| JP | 2012074007 A | 4/2012 |
| JP | 2013-518449 A | 5/2013 |
| JP | 2015162113 A | 9/2015 |
| JP | 2017102619 A | 6/2017 |
| JP | 2017157112 A | 9/2017 |
| JP | 2019040984 A | 3/2019 |
| JP | 2019046380 A | 3/2019 |
| JP | 2019079214 A | 5/2019 |
| JP | 2019165123 A | 9/2019 |
| KR | 10-2019-0108473 A | 9/2019 |
| TW | 201432479 A | 8/2014 |

OTHER PUBLICATIONS

Numata et al. "Experiments of a New Meta-Heuristics to Reduce the Search Space by Partially Fixing of the Solution Values—Application to Traveling Salesman Problem" Transactions of the Institute of Systems, Control and Information Engineers, vol. 17, No. 3, Mar. 2004, pp. 103-112.

Office Action dated May 20, 2022 in Korean Application No. 10-2021-7001392.

Cunha et al. "Mathematical Modelling and Solution Approaches for Production Planning in a Chemical Industry" Pesquisa Operacional, Jun. 2017, vol. 37, No. 2, pp. 311-331.

| OUTPUT PARAMETER | x1 | x2 | x3 | x4 | x5 | x6 | x7 | x8 |
|---|---|---|---|---|---|---|---|---|
| GOAL VALUE | 860 | 750 | 1000 | 800 | 800 | 800 | 800 | 0 |
| WEIGHT | 1 | 1 | 2 | 2 | 2 | 2 | 2 | 2 |

FIG. 6

|  | GAS PRESSURE | ELECTRICAL DISCHARGE POWER | BIAS POWER | GAS TYPE 1 | GAS TYPE 2 | GAS TYPE 3 | GAS TYPE 4 |
|---|---|---|---|---|---|---|---|
| MAXIMUM VALUE | 10 | 1000 | 100 | 200 | 200 | 200 | 200 |
| MINIMUM VALUE | 1 | 500 | 0 | 0 | 0 | 0 | 0 |

FIG. 7

|  | GAS PRESSURE | ELECTRICAL DISCHARGE POWER | BIAS POWER | GAS TYPE 1 | GAS TYPE 2 | GAS TYPE 3 | GAS TYPE 4 |
|---|---|---|---|---|---|---|---|
| SELECTION | Y | Y | Y | Y | Y | Y | N |

FIG. 8

|  | GAS PRESSURE | ELECTRICAL DISCHARGE POWER | BIAS POWER | GAS TYPE 1 | GAS TYPE 2 | GAS TYPE 3 |
|---|---|---|---|---|---|---|
| CONDITION 1 | 5.5 | 750 | 50 | 66.7 | 66.7 | 66.7 |
| CONDITION 2 | 10 | 750 | 50 | 66.7 | 66.7 | 66.7 |
| CONDITION 3 | 1 | 750 | 50 | 66.7 | 66.7 | 66.7 |
| CONDITION 4 | 5.5 | 1000 | 50 | 66.7 | 66.7 | 66.7 |
| CONDITION 5 | 5.5 | 500 | 50 | 66.7 | 66.7 | 66.7 |
| CONDITION 6 | 5.5 | 750 | 100 | 66.7 | 66.7 | 66.7 |
| CONDITION 7 | 5.5 | 750 | 0 | 66.7 | 66.7 | 66.7 |
| CONDITION 8 | 5.5 | 750 | 50 | 200 | 0 | 0 |
| CONDITION 9 | 5.5 | 750 | 50 | 0 | 100 | 100 |
| CONDITION 10 | 5.5 | 750 | 50 | 0 | 200 | 0 |
| CONDITION 11 | 5.5 | 750 | 50 | 100 | 0 | 100 |
| CONDITION 12 | 5.5 | 750 | 50 | 0 | 0 | 200 |
| CONDITION 13 | 5.5 | 750 | 50 | 100 | 100 | 0 |

|  | x1 | x2 | x3 | x4 | x5 | x6 | x7 | x8 |
|---|---|---|---|---|---|---|---|---|
| CONDITION 1 | a1 | b1 | c1 | d1 | e1 | f1 | g1 | h1 |
| CONDITION 2 | a2 | b2 | c2 | d2 | e2 | f2 | g2 | h2 |
| CONDITION 3 | a3 | b3 | c3 | d3 | e3 | f3 | g3 | h3 |
| CONDITION 4 | a4 | b4 | c4 | d4 | e4 | f4 | g4 | h4 |
| CONDITION 5 | a5 | b5 | c5 | d5 | e5 | f5 | g5 | h5 |
| CONDITION 6 | a6 | b6 | c6 | d6 | e6 | f6 | g6 | h6 |
| CONDITION 7 | a7 | b7 | c7 | d7 | e7 | f7 | g7 | h7 |
| CONDITION 8 | a8 | b8 | c8 | d8 | e8 | f8 | g8 | h8 |
| CONDITION 9 | a9 | b9 | c9 | d9 | e9 | f9 | g9 | h9 |
| CONDITION 10 | a10 | b10 | c10 | d10 | e10 | f10 | g10 | h10 |
| CONDITION 11 | a11 | b11 | c11 | d11 | e11 | f11 | g11 | h11 |
| CONDITION 12 | a12 | b12 | c12 | d12 | e12 | f12 | g12 | h12 |
| CONDITION 13 | a13 | b13 | c13 | d13 | e13 | f13 | g13 | h13 |

FIG. 11

FIRST-ROUND ESTIMATION PROCESS

|  | x1 | x2 | x3 | x4 | x5 | x6 | x7 | x8 |
|---|---|---|---|---|---|---|---|---|
| GOAL | a1_0 | b1_0 | c1_0 | d1_0 | e1_0 | f1_0 | g1_0 | h1_0 |
| TARGET 1-1 | a1_1 | b1_1 | c1_1 | d1_1 | e1_1 | f1_1 | g1_1 | h1_1 |
| TARGET 1-2 | a1_2 | b1_2 | c1_2 | d1_2 | e1_2 | f1_2 | g1_2 | h1_2 |
| TARGET 1-3 | a1_3 | b1_3 | c1_3 | d1_3 | e1_3 | f1_3 | g1_3 | h1_3 |
| TARGET 1-4 | a1_4 | b1_4 | c1_4 | d1_4 | e1_4 | f1_4 | g1_4 | h1_4 |

FIFTH-ROUND ESTIMATION PROCESS

|  | x1 | x2 | x3 | x4 | x5 | x6 | x7 | x8 |
|---|---|---|---|---|---|---|---|---|
| GOAL | a5_0 | b5_0 | c5_0 | d5_0 | e5_0 | f5_0 | g5_0 | h5_0 |
| TARGET 5-1 | a5_1 | b5_1 | c5_1 | d5_1 | e5_1 | f5_1 | g5_1 | h5_1 |
| TARGET 5-2 | a5_2 | b5_2 | c5_2 | d5_2 | e5_2 | f5_2 | g5_2 | h5_2 |
| TARGET 5-3 | a5_3 | b5_3 | c5_3 | d5_3 | e5_3 | f5_3 | g5_3 | h5_3 |
| TARGET 5-4 | a5_4 | b5_4 | c5_4 | d5_4 | e5_4 | f5_4 | g5_4 | h5_4 |

TENTH-ROUND ESTIMATION PROCESS

|  | x1 | x2 | x3 | x4 | x5 | x6 | x7 | x8 |
|---|---|---|---|---|---|---|---|---|
| GOAL | a10_0 | b10_0 | c10_0 | d10_0 | e10_0 | f10_0 | g10_0 | h10_0 |
| TARGET 10-1 | a10_1 | b10_1 | c10_1 | d10_1 | e10_1 | f10_1 | g10_1 | h10_1 |
| TARGET 10-2 | a10_2 | b10_2 | c10_2 | d10_2 | e10_2 | f10_2 | g10_2 | h10_2 |
| TARGET 10-3 | a10_3 | b10_3 | c10_3 | d10_3 | e10_3 | f10_3 | g10_3 | h10_3 |
| TARGET 10-4 | a10_4 | b10_4 | c10_4 | d10_4 | e10_4 | f10_4 | g10_4 | h10_4 |

FIG. 12
FIRST-ROUND ESTIMATION PROCESS
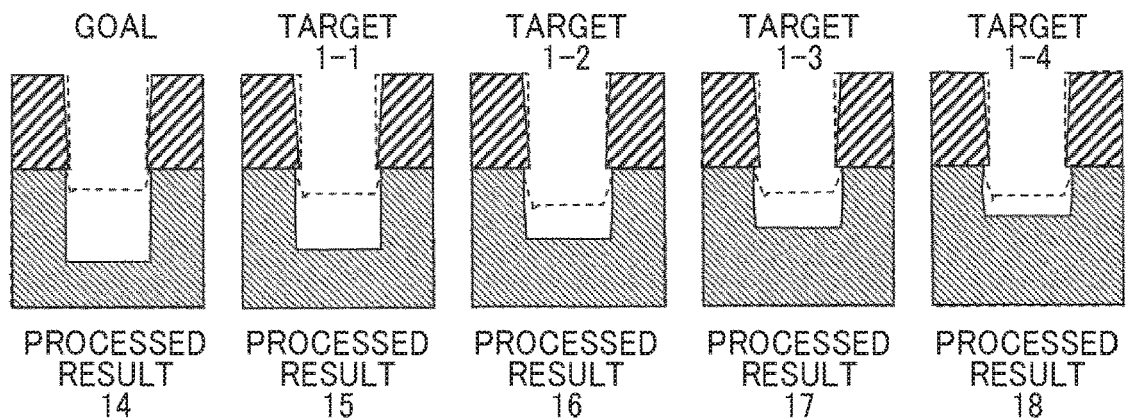
FIFTH-ROUND ESTIMATION PROCESS
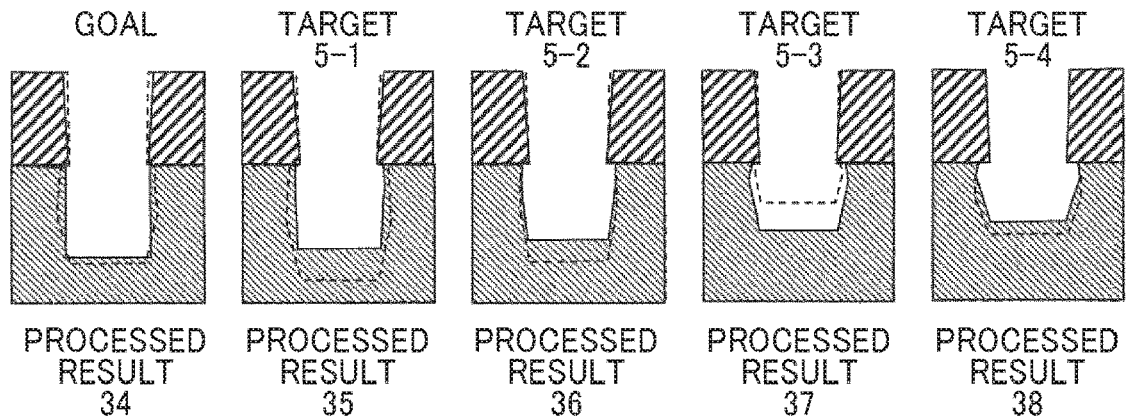
TENTH-ROUND ESTIMATION PROCESS
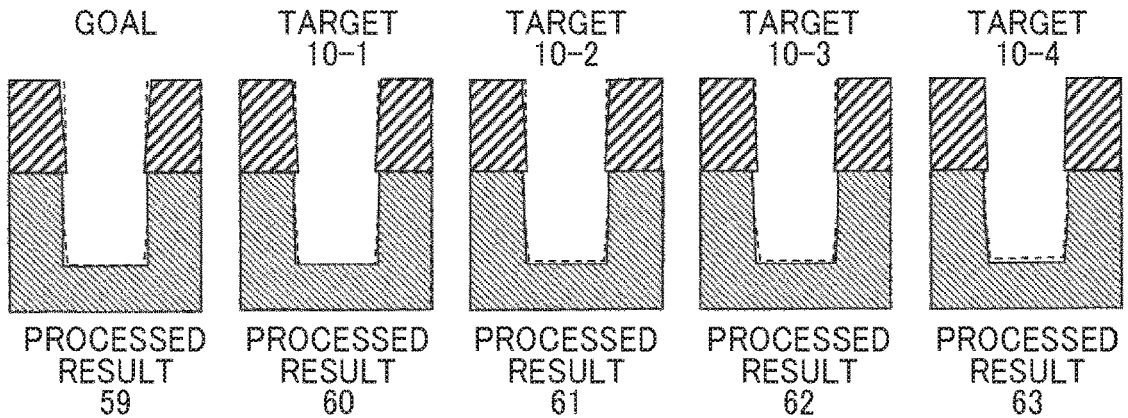

| OUTPUT PARAMETER | MELTING POINT | BOILING POINT | DENSITY | THERMAL CONDUCTIVITY | ELECTRIC CONDUCTIVITY | BULK MODULUS |
|---|---|---|---|---|---|---|
| GOAL VALUE | a | b | c | d | e | f |
| WEIGHT | 1 | 1 | 1 | 1 | 1 | 2 |

| | REACTION TEMPERATURE | REACTION TIME | STIRRING FREQUENCY | MATERIAL 1 RATIO | MATERIAL 2 RATIO | MATERIAL 3 RATIO | MATERIAL 4 RATIO |
|---|---|---|---|---|---|---|---|
| MAXIMUM VALUE | 100 | 10 | 1000 | 100 | 100 | 100 | 100 |
| MINIMUM VALUE | 30 | 1 | 100 | 0 | 0 | 0 | 0 |

FIG. 16

| | REACTION TEMPERATURE | REACTION TIME | STIRRING FREQUENCY | MATERIAL 1 | MATERIAL 2 | MATERIAL 3 | MATERIAL 4 |
|---|---|---|---|---|---|---|---|
| SELECTION | Y | Y | Y | Y | Y | Y | N |

FIG. 17

| | REACTION TEMPERATURE | REACTION TIME | STIRRING FREQUENCY | MATERIAL 1 RATIO | MATERIAL 2 RATIO | MATERIAL 3 RATIO |
|---|---|---|---|---|---|---|
| CONDITION 1 | 65 | 5.5 | 550 | 33.3 | 33.3 | 33.3 |
| CONDITION 2 | 100 | 5.5 | 550 | 33.3 | 33.3 | 33.3 |
| CONDITION 3 | 30 | 5.5 | 550 | 33.3 | 33.3 | 33.3 |
| CONDITION 4 | 65 | 10 | 550 | 33.3 | 33.3 | 33.3 |
| CONDITION 5 | 65 | 1 | 550 | 33.3 | 33.3 | 33.3 |
| CONDITION 6 | 65 | 5.5 | 1000 | 33.3 | 33.3 | 33.3 |
| CONDITION 7 | 65 | 5.5 | 100 | 33.3 | 33.3 | 33.3 |
| CONDITION 8 | 65 | 5.5 | 550 | 100 | 0 | 0 |
| CONDITION 9 | 65 | 5.5 | 550 | 0 | 50 | 50 |
| CONDITION 10 | 65 | 5.5 | 550 | 0 | 100 | 0 |
| CONDITION 11 | 65 | 5.5 | 550 | 50 | 0 | 50 |
| CONDITION 12 | 65 | 5.5 | 550 | 0 | 0 | 100 |
| CONDITION 13 | 65 | 5.5 | 550 | 50 | 50 | 0 |

FIG. 18
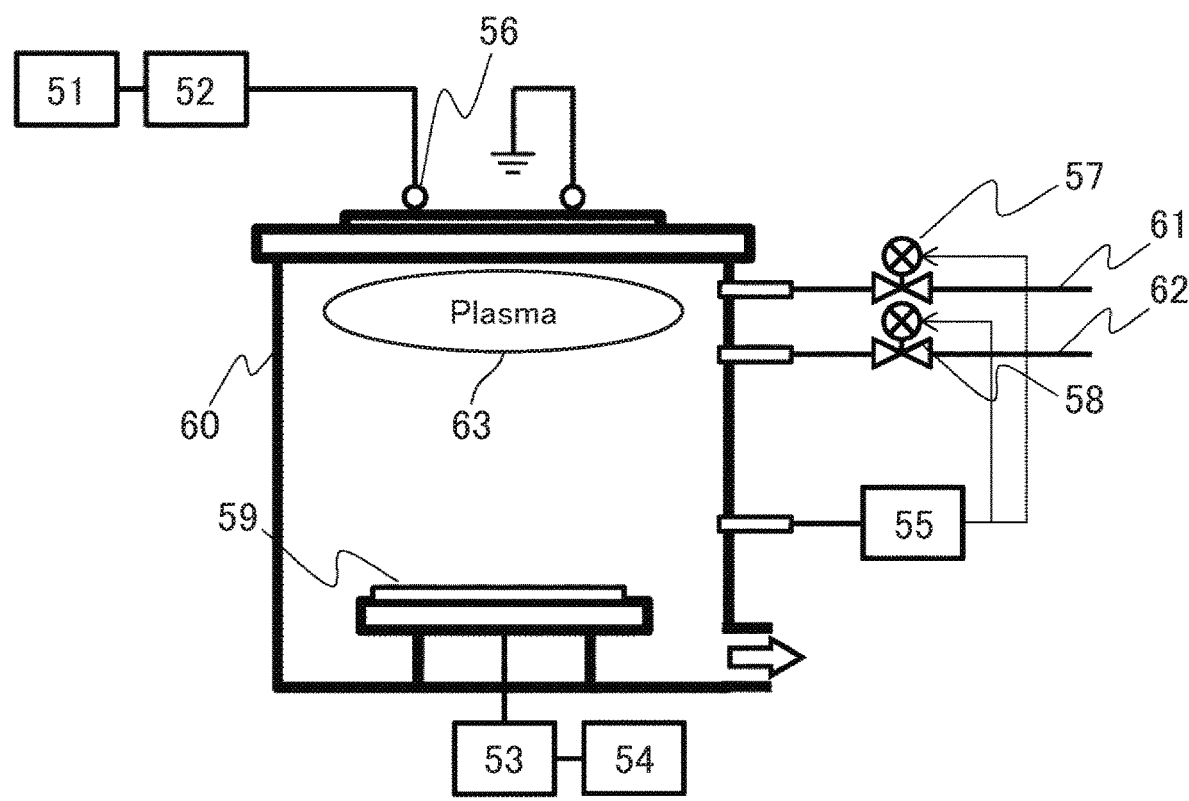
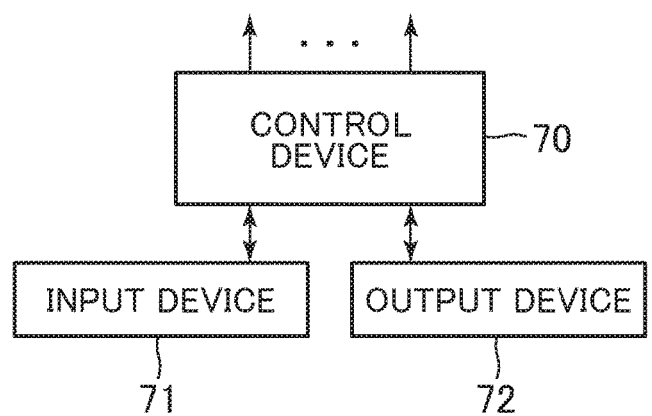

SEARCH DEVICE, SEARCHING METHOD, AND PLASMA PROCESSING APPARATUS

CROSS-REFERENCE TO RELATED APPLICATION

This application claims priority from Japanese Patent Application No. 2018-46238 filed on Mar. 14, 2018, the entire contents of which are incorporated by reference herein.

BACKGROUND

The present invention relates to a search device and a searching method configured to search for an optimal solution of processing, and a plasma processing apparatus having a function of optimizing the processing.

In recent years, new materials are introduced as materials of a semiconductor device for improvement of performance of the semiconductor device and the structure of the semiconductor device becomes three-dimensional and complicated simultaneously with introduction of the new materials. In addition, nanometer-level accuracy is requested in processing of a current advanced semiconductor device. Accordingly, it is necessary for a semiconductor processing device to be able to process various materials into various shapes with an extremely high accuracy and therefore the semiconductor processing device is structured as a device for which many control parameters (input parameters) are inevitably set.

In association with the above-described situation, it is necessary to determine several kinds to several dozen kinds of control parameters in order to fully elicit the performance of the semiconductor processing device. Therefore, as the performance of the semiconductor processing device is improved, the semiconductor processing device becomes more complicated and it becomes more difficult to find out a combination of the control parameters with which a desirable processing result is obtained. Complication of the semiconductor processing device and difficulty in finding out the combination of the control parameters induce prolongation of device development period and become a cause for an increase in development cost.

Accordingly, a function and a device which are able to search for an optimal control parameter semi-automatically and to elicit the performance of the semiconductor processing device with ease come to be requested.

In addition, searching-for of the optimal solution is an issue which would be encountered at manufacturing and development stages of various products, for example, in setting of conditions of a working device for metallic products and a processing device for plastic products, searching-for of high-performance novel materials used in polymers, batteries, magnets, medicines and so forth, not limited to the semiconductor processing device.

Japanese Unexamined Patent Application Publication (Translation of PCT Application) No. 2013-518449 discloses a method and a system configured to automatically correct input parameter values of a semiconductor processing device in accordance with a change with time of the semiconductor processing device by being equipped with an autonomous learning engine.

Japanese Unexamined Patent Application Publication No. Hei 10-86039 discloses a device which automatically corrects input parameter values of a cutting device by using machine learning.

SUMMARY

Techniques disclosed in Japanese Unexamined Patent Application Publication (Translation of PCT Application) No. 2013-518449 and Japanese Unexamined Patent Application Publication No. Hei 10-86039 are of the type of obtaining the optimal input parameter values by conducting some experiment in advance and then following the later change with time of the device. Accordingly, it is necessary to still determine the initial optimal conditions themselves through an experiment which requires many man-hours.

In addition, in the techniques disclosed in Japanese Unexamined Patent Application Publication (Translation of PCT Application) No. 2013-518449 and Japanese Unexamined Patent Application Publication No. Hei 10-86039, mass learning data is used for learning of the autonomous learning engine and learning of a prediction model in the machine learning. In a case of the processing device, the learning data is a group of pieces of data configured by sets of input parameter values of control parameters of the device concerned and output parameter values which indicate results of processing performed by the processing device. However, in general, there are many cases where time and labor are taken for acquiring the output parameter values. For example, in an etching device which is one kind of the semiconductor processing device, it is necessary to observe a section of a sample through an electron microscope by breaking the sample and to quantify a sectional shape of the sample in order to acquire data on processing results. In such a case, difficulties attend on preparation of mass data.

The larger the preparable number of pieces of learning data is, the more the accuracy of the prediction model is improved. Therefore, it follows that the learning data is prepared under a condition that input parameters are comprehensively assigned within the range of the specification of the device used. Alternatively, in a case where a user has knowledge of domains and it is possible to limit a parameter area where the optimal solution may be obtained, it is also possible to allocate many data points to that parameter area. However, even when the model is learned on the basis of the preparable number of pieces of data which is, for example, in the order of 100 pieces of data, in a case where there are many kinds of the input parameters, it is expected that a desirable result would not be obtained due to insufficiency of the accuracy of the prediction model. In this case, it is necessary to continue searching-for of the solution while updating the prediction model by adding the data points to an area where the optimal solution is expected to be included. Even this method has such an issue that many man-hours are necessary for preparation itself of initial learning data.

The present invention aims to promote efficiency of device operation by efficiently searching for an optimal input parameter value (an optimal processing condition) of each parameter of a processing device which realizes a processed result which is set as the goal while using a small number of pieces of data.

According to one aspect of the present invention, there is provided a search device which searches a processing device which performs predetermined processing for an input parameter value of each control parameter of the processing device which corresponds to a goal output parameter value to be given to the processing device, including a processor, a memory, and a search program which is stored in the memory and is used to search for the input parameter value which corresponds to the goal output parameter value by being executed by the processor, in which the search program has a model learning unit, a target setting unit, a processing condition search unit, and a convergence decision unit, the model learning unit learns a prediction model from learning data which is sets of the input parameter values of the processing device and output parameter values which are results of the processing that the processing device performs on the basis of the input parameter values, the target setting unit sets a target output parameter value by interpolating values between the goal output parameter value and an output parameter value which is the closest to the goal output parameter in the output parameter values in the learning data, the processing condition search unit estimates input parameter values which correspond to the goal output parameter value and the target output parameter values by using the prediction model, the convergence decision unit decides whether the output parameter value which is the result of the processing that the processing device performs on the basis of the input parameter value that the processing condition search unit estimates converges to the goal output parameter value in a predetermined range, and in a case where the convergence decision unit decides non-convergence thereof, the model learning unit updates the prediction model by adding a set of the input parameter value that the processing condition search unit estimates and the output parameter value which is the result of the processing that the processing device performs on the basis of the estimated input parameter value to the learning data and the target setting unit resets the target output parameter value, and thereby searching-for of an input parameter value which corresponds to the goal output parameter value is continued.

It becomes possible to promote efficiency of the operation of the processing device and optimization of processing. Problems, configurations and effects other than the above-described ones will become apparent from the following description of embodiments of the present invention.

BRIEF DESCRIPTION OF THE DRAWINGS

FIG. 6 is a table illustrating one example of input parameter settable ranges;

FIG. 7 is a table illustrating one example of selection of the input parameters;

FIG. 8 is a table illustrating one example of automatically set initial processing conditions;

FIG. 11 is tables illustrating one example of a transition of output parameter values (processed results) when performing estimation repetitively;

FIG. 12 is diagrams illustrating one example of a transition of the processed shapes when performing the estimation repetitively;

FIG. 16 is a table illustrating one example of selection of the input parameters;

FIG. 17 is a table illustrating one example of automatically set initial processing conditions; and FIG. 18 is a schematic diagram illustrating one example of a plasma processing apparatus having an optimal processing condition search function.

Figure 1:
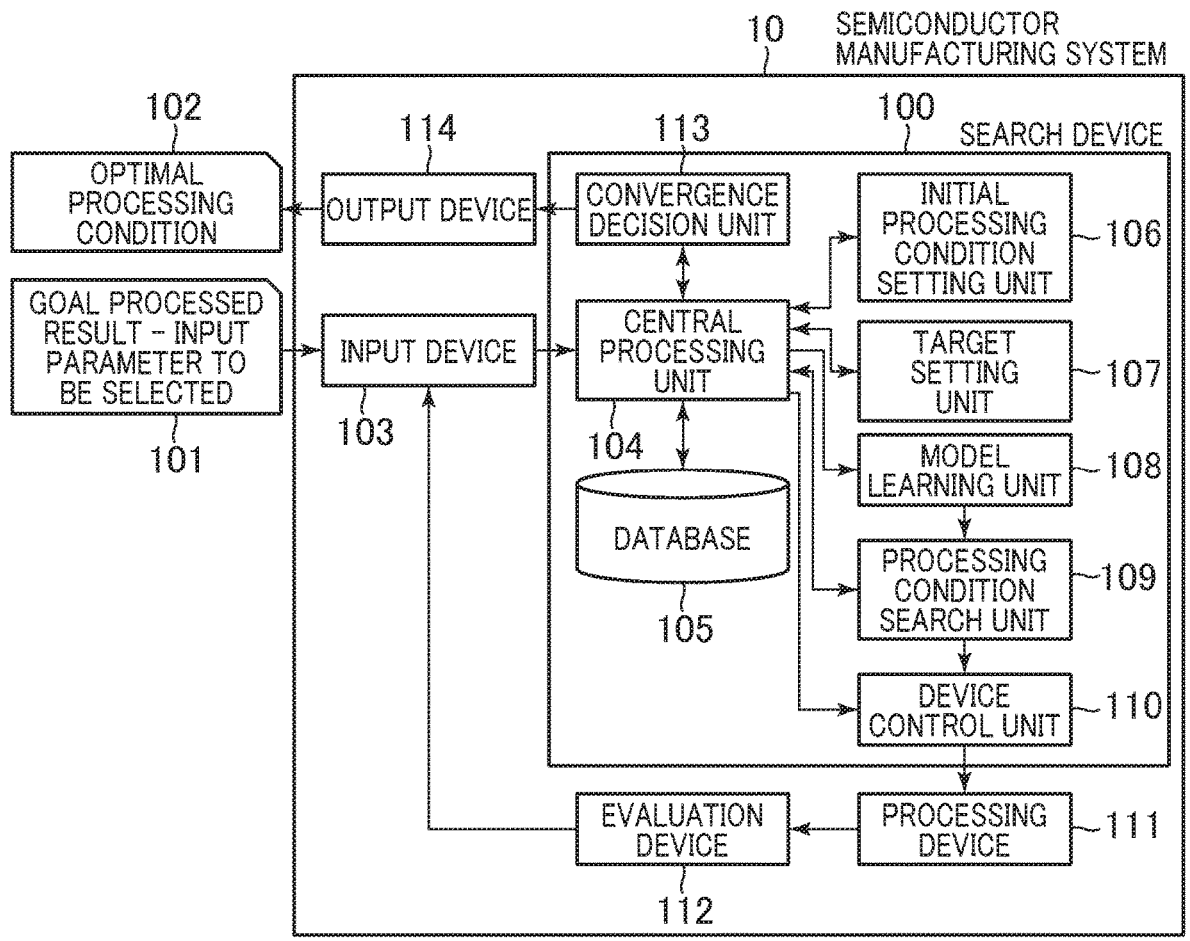
FIG. 1 is a diagram illustrating one system configuration example of a semiconductor manufacturing system.

In searching for an optimal solution of each parameter, it is not necessary to prepare a prediction model which allows highly accurate prediction over the whole parameter space and it is sufficient to prepare a prediction model which allows highly accurate prediction of only the vicinity of the optimal solution. Contribution of a data point which is separated from the optimal solution in the parameter space is small and contribution of a data point which is located in the vicinity of the optimal solution in the parameter space is large for the purpose of searching out the optimal solution. That is, contribution of most of the data points which are comprehensively arranged in the parameter space is small. Accordingly, since it is desirable to reduce the number of pieces of initial learning data as many as possible, the minimum number of pieces of the initial learning data which is necessary to search for the optimal solution in the parameter space is set as the initial learning data in embodiments of the present invention. For example, three levels, that is, a maximum value, a minimum value and a mean value are set for each parameter. Alternatively, conditions may be set on the basis of an orthogonal table depending on the number of the parameters used.

On the other hand, in a case of gradually improving the accuracy of the prediction model by adding learning data, it is desirable to prepare data which is close to the optimal solution and is large in contribution. It is impossible to set the data point aiming at the vicinity of the optimal solution at the time point of preparation of the initial learning data. However, presence of a once learned prediction model allows estimation of an optimal input parameter value within an accuracy range of the prediction model obtained at that time point and the possibility that the value is the value of a data point which is located in the vicinity of a true optimal solution (a global solution) or in the vicinity of a local solution is high. When adopting an approach of searching for the optimal solution while narrowing the parameter space to be searched, the possibility to get into searching-out of the local solution is high in a case where the number of pieces of data is small. Accordingly, in the embodiments of the present invention, a target output parameter value which is close to a goal output parameter value is set and an input parameter value which corresponds to the target output parameter value is calculated backward by using the prediction model which is obtained at that time point. There is the possibility that the input parameter value so obtained is the value of the data point which is located in the vicinity of the local solution or the global solution. It becomes possible to search out the global solution by repetitively performing the abovementioned operation, not getting into searching-out of the local solution.

From the above, only the minimum number of pieces of the initial learning data which is necessary for performing a search the parameter space is set. On the other hand, the target output parameter values which are close to the goal output parameter value are set so as to obtain data which is located in the vicinities of the local solution and the optimal solution as the learning data to be added and the input parameter values (the processing conditions) which correspond to a goal output parameter value (a goal processed result) and the target output parameter values are searched for. Thereby, it becomes possible to efficiently search out the optimal solution while suppressing the number of pieces of data used.

In the following, the embodiments of the present invention will be described on the basis of the appended drawings.

First Embodiment

FIG. 1 is a diagram illustrating one system configuration example of a semiconductor manufacturing system 10 according to the first embodiment of the present invention. The semiconductor manufacturing system 10 has a search device 100, an input device 103, an output device 114, a processing device 111, an evaluation device 112 and so forth.

The processing device 111 is a device which processes a semiconductor or a semiconductor device which includes the semiconductor. There is no particular limitation to the contents of processing that the processing device 111 performs. A lithography device, a film formation device, a patterning device, an ion implantation device and a cleaning device are examples of the processing device 111. An exposure device, an electron beam lithography device and an X-ray lithography device are examples of the lithography device. A CVD (Chemical Vapor Deposition) device, a PVD (Physical Vapor Deposition) device, a vapor deposition device, a sputtering device and a thermal oxidation device are examples of the film formation device. A wet etching device, a dry etching device, an electron beam machining device and a laser beam machining device are examples of the patterning device. A plasma doping device and an ion beam doping device are examples of the ion implantation device. A liquid cleaning device and an ultrasonic cleaning device are examples of the cleaning device.

The processing device 111 performs processing on the semiconductor or the semiconductor device on the basis of the processing condition (the input parameter value of each parameter) which is input from the search device 100 and transfers the processed semiconductor or semiconductor device to the evaluation device 112. The evaluation device 112 measures the semiconductor or semiconductor device which is processed by the processing device 111 and acquires the processed result (the output parameter value). For example, an optical monitor and a processed dimension measuring device using an electron microscope are examples of the evaluation device 112. Part of the semiconductor or the semiconductor device which is processed by the processing device 111 may be taken out as a fragment and the fragment may be transported to the evaluation device 112 and measured by the evaluation device 112.

The search device 100 has a central processing unit 104, a database 105, an initial processing condition setting unit 106, a target setting unit 107, a model learning unit 108, a processing condition search unit 109, a device control unit 110, a convergence decision unit 113 and so forth. The contents of individual blocks (units) will be described later by using a flowchart.

The input device 103 is equipped with an input interface such as a GUI (Graphical User Interface) and so forth and a storage medium reader such as a card reader and so forth and inputs data into the search device 110. In addition, the input device 103 accepts an actual measured value sent from the evaluation device 112 similarly, not limited to value acceptance from a user and inputs the accepted value into the search device 100. For example, a keyboard, a mouse, a touch panel and the storage medium reader are examples of the input device 103.

The output device 114 displays the processing condition which is transferred from the search device 100 to the user as an optimal processing condition 102. As a way of displaying the optimal processing condition 102, there are displaying on a display, writing to a file and so forth. For example, the display, a printer and a storage medium writer are examples of the output device 114.

Figure 2:
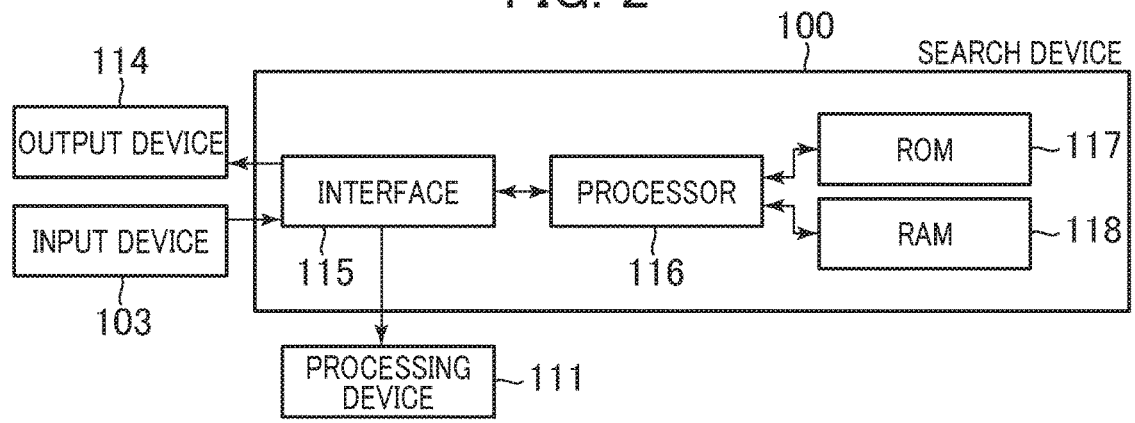
FIG. 2 is a block diagram illustrating one hardware configuration example of a search device.

FIG. 2 is a block diagram illustrating one hardware configuration example of the search device 110. The search device 100 searches for the input parameter value of each parameter (the processing condition) for the processing device 111, which is input from the input device 103 and is used for achieving the goal output parameter value (the goal processed result). The search device 100 has a processor 116, a communication interface 115, a ROM (Read Only Memory) 117, a RAM (Random Access Memory) 118 and so forth. The communication interface 115 connects the processor 116, an external input device 103, the output device 114 and the processing device 111 with one another. The communication interface 115, the ROM 117 and the RAM 118 are connected to the processor 116. A table indicating settable ranges of input parameters for the processing device 111, constraint conditions on the parameters, convergence decision conditions, a processing program to be executed by the processor 116 are stored in the ROM 117. Learning data, a leaning model and so forth which are generated in the course of searching are stored in the RAM 118.

Incidentally, in the correspondence with the configuration in FIG. 1, the database 105 is implemented as the ROM 117 and the RAM 118 and each block (unit) in the search device 100 is implemented as a program (a search program) to be stored in the ROM 117.

Figure 3:
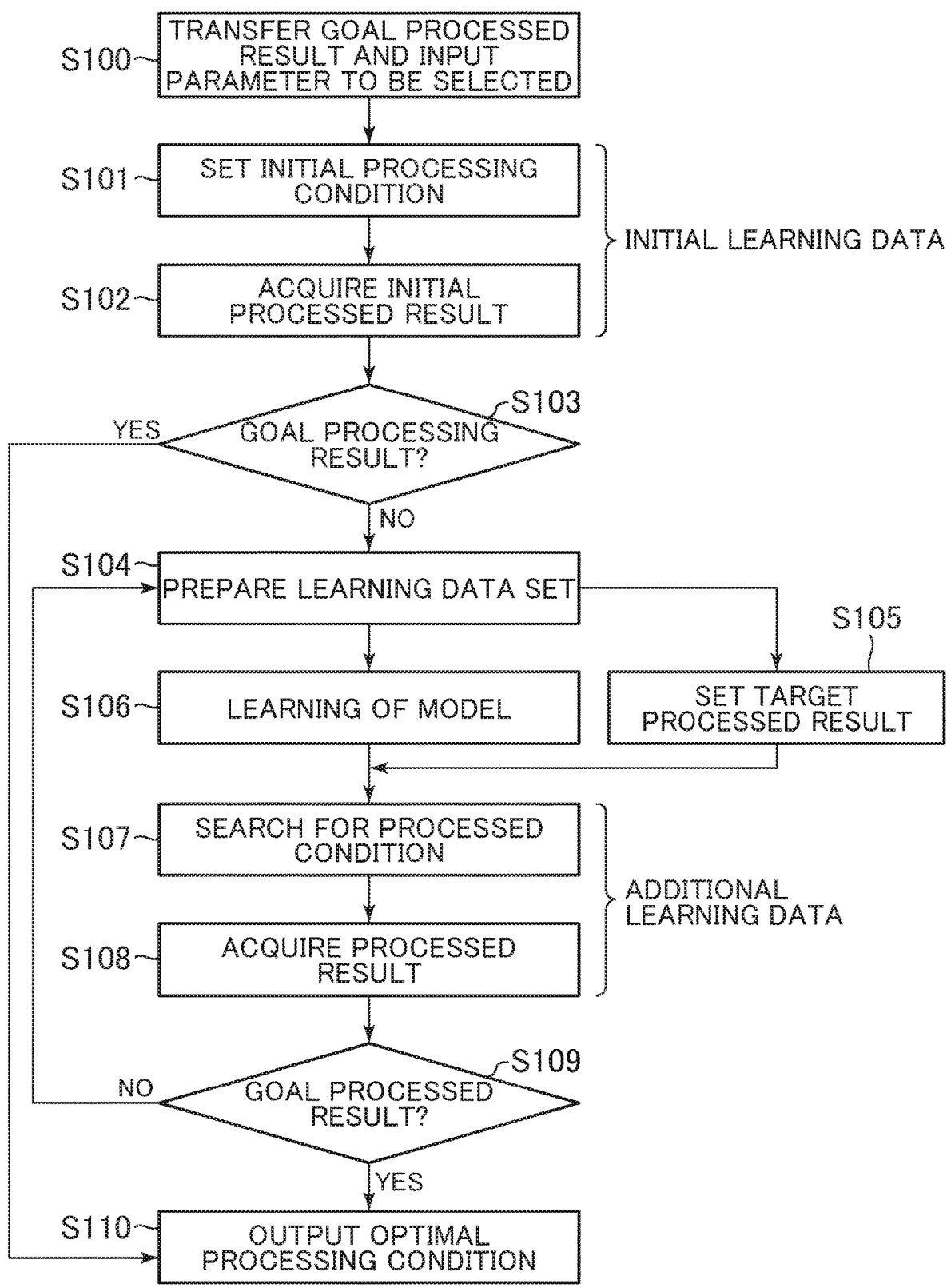
FIG. 3 is a flowchart illustrating one example of procedures for determining an optimal processing condition from a goal processed result.

FIG. 3 is a flowchart illustrating one example of procedures for determining the optimal processing condition 102 of the processing device 111 from the goal processed result (the goal output parameter value) that the search device 100 executes in the semiconductor manufacturing system 10.

First, in regard to processing that the processing device 111 performs, the goal processed result (the goal output parameter value) which is set as a goal and an input parameter 101 to be selected as a parameter for controlling the processing device 111 are transferred from the input device 103 to the central processing unit 104 (step S100).

Next, the central processing unit 104 stores the accepted goal output parameter and the selected input parameter 101 into the database 105 and transfers the selected input parameter 101 to the initial processing condition setting unit 106. The initial processing condition setting unit 106 reads data on the input parameter settable ranges out of the database 105 on the basis of the transferred input parameter 101 and automatically sets the initial processing condition (step S101). A method of setting the initial processing condition will be described later by using a specific example. The central processing unit 104 stores the set initial processing condition into the database 105 and transfers the set initial processing condition to the device control unit 110.

The device control unit 110 transmits the initial processing condition to the processing device 111. Alternatively, the user may input the initial processing condition that the device control unit 110 outputs into the processing device 111. The processing device 111 performs processing in accordance with the input initial processing condition and the evaluation device 112 evaluates the processed result and inputs an evaluated processed result (an initial processed result) into the input device 103. The initial processed result is transferred from the input device 103 to the central processing unit 104 (step S102). The central processing unit 104 transfers the initial processing condition and the initial processed result to the convergence decision unit 113.

The convergence decision unit 113 compares the initial processed result with the goal processed result and decides whether the initial processed result converges to the goal processed result within a predetermined accuracy range (step S103). In a case of convergence of the initial processed result, the convergence decision unit 113 transfers the initial processed result which converges to the goal processed result to the output device 114 and the output device 114 outputs the initial processed result as the optimal processing condition 102 (step S110).

It is possible to use a square sum of errors between the respective output parameter values and the respective goal output parameter values relating to all output parameters used which is given by (Numerical Formula 1) in decision of convergence of the output parameter value (the processed result).

[Numerical Formula 1]

$$\Sigma_{i=1}^{NP}(x_i-y_i)^2 \cdot W_i \quad (1)$$

Here, NP is the total number of the output parameters used, $x_i$ is an i-th goal output parameter value, $y_i$ is an i-th output parameter value (an actual value) and $W_i$ is a weight that the user designates for every output parameter.

On the other hand, in a case of non-convergence of the initial processed result, a command to continue execution of the processing is sent from the convergence decision unit 113 to the central processing unit 104 and the central processing unit 104 prepares initial learning data configured by the initial processing conditions (initial input parameter values) and the initial processed results (initial output parameter values) of the respective parameters in the database 105 (step S104).

Next, the central processing unit 104 reads the goal output parameter values (the goal processed results) and the initial learning data out of the database 105 and transfers the read-out goal output parameter values (the goal processed results) and initial learning data to the target setting unit 107. The target setting unit 107 sets a target processed result (the target output parameter value of each parameter) (step S105). The target output parameter value which is set is transferred to the central processing unit 104 and is stored into the database 105.

The target processed result (the target output parameter value) that the target setting unit 107 sets will be described. In general, even when the optimal processing condition is searched for by targeting on only the goal output parameter value of each parameter, in a case where the number of pieces of the learning data is small, a difference between the best output parameter value (the actual value) which is obtained and the goal output parameter value is large and it is impossible to approach the optimal processing condition (an optimal input parameter value) with ease. Accordingly, in the present embodiment, the value is brought close to the optimal solution little by little by setting a goal processed result (referred to as the target output processed result (the target output parameter value)) which is acquired at an intermediate stage of acquisition of values ranging from the best output parameter value which is already obtained, that is, the best output parameter value in the learning data acquired at that time to the goal output parameter value. In addition, since the possibility that data which is close to the goal output parameter value is located in the vicinity of the optimal solution in the parameter space is high, also an effect of improving the accuracy of the prediction model by increasing the number of pieces of the learning data which is located in the vicinity of the optimal solution is obtained. Accordingly, the target setting unit 107 sets the target output parameter value by selecting the best data (the output parameter value (the actual value)) which is the closest to the goal output parameter value from the output parameter values in the existing learning data and interpolating values between the output parameter value which is the best value at that time and the goal output parameter value. Although any number of the target output parameter values may be set as long as one or more target output parameter values are set, it is desirable to set a plurality of the target output parameter values, for example, about four to five target output parameter values in consideration of the efficiency.

Next, the central processing unit 104 reads the initial learning data out of the database 105 and sends the read-out initial learning data to the model learning unit 108. The model learning unit 108 learns the prediction model for relating the input parameter value (the processing condition) to the output parameter value (the processed result) (step S106). A neural network, a support vector machine, a Kernel method and so forth may be used as the prediction model. The prediction model so learned is transferred to the processing condition search unit 109.

Next, the processing condition search unit 109 searches for the processing conditions for the goal output parameter value and the target output parameter value which are read out of the database 105 by using the prediction model which is transferred from the model learning unit 108 and the constraint condition on the input parameter which is read out of the database 105 (step S107). Since the prediction model is in the form that the processing condition is set as the input parameter value and the processed result is set as the output parameter value, it is possible to use various optimal solution searching methods such as, for example, a simulated annealing method, a genetic algorithm and so forth in order to inversely obtain the processing condition from the processed result. On the other hand, in a case where a prediction model that the processed result is set as the input parameter value and the processing condition is set as the output parameter value is prepared, there is the possibility that the obtained processing condition may not fall within the settable range and in addition there is the possibility that different processing conditions may give similar processed results. For this reason, such an issue that the plurality of processing conditions become candidates for the solution occurs. Accordingly, the method of obtaining the processing condition from the processed result by using the prediction model is adopted. The processing condition search unit 109 transfers the searched-out processing condition (the target input parameter value) to the device control unit 110 and stores the searched-out processing condition (the target input parameter value) into the database 105 via the central processing unit 104.

The device control unit 110 transmits the transferred processing condition (the target input parameter value) to the processing device 111. Alternatively, the user may input the processing condition that the device control unit 110 outputs into the processing device 111. The processing device 111 performs processing in accordance with the input processing condition and the evaluation device 112 evaluates the processing and inputs the acquired processed result (the target output parameter value) into the input device 103. The central processing unit 104 acquires the processed result (the target output parameter value) from the input device 103 (step S108). The central processing unit 104 transfers the processing condition (the target input parameter value) and the processed result (the target output parameter value) to the convergence decision unit 113.

The convergence decision unit 113 compares the processed result (the output parameter value (the actual value)) with the goal processed result (the goal output parameter value) and decides whether the processed result converges to the goal processed result within a predetermined accuracy range (step S109). In a case of convergence of the processed result to the goal processed result, the convergence decision unit 113 transfers the processed result which converges to the goal processed result to the output device 114 and the output device 114 outputs the received processing condition as the optimal processing condition 102 (step S110).

On the other hand, in a case of non-convergence, a command to continue execution of the processing is sent from the convergence decision unit 113 to the central processing unit 104 and the central processing unit 104 updates learning data set by adding a set of newly searched processing conditions (the input parameter values) for the goal processed result and the target processed result and the processed results (the output parameter values (the actual values)) thereof to the learning data set in the database 105 as additional leaning data (step S104).

Then, an estimation process ranging from preparation and updating of the learning data set (S104) to decision on convergence (S109) is repetitively executed until the processed result converges to the goal processed result. The optimal processing condition for achieving the goal processed result is autonomously searched for in this way.

Figures 4, 5:
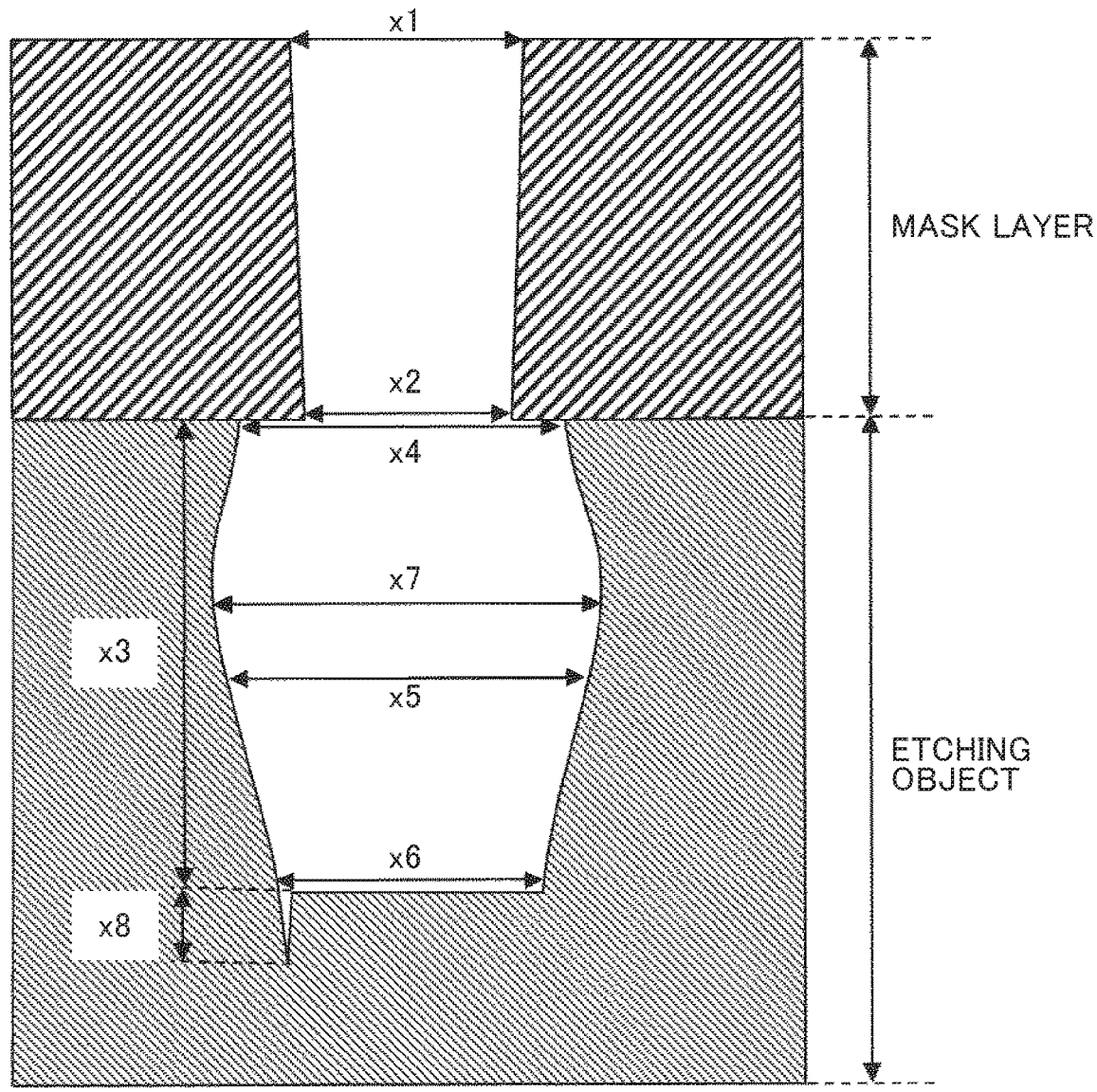
FIG. 4 is a diagram for explaining goal output parameters which are exemplified.
FIG. 5 is a table illustrating one example of goal output parameters.

In the following, an example that the processing device 111 is configured as an etching device will be described. FIG. 4 is a diagram illustrating one example of output parameters in this example and the respective output parameters indicate dimensions of a sectional shape obtained after processed. The sectional shape so processed is acquired by reading values of the output parameters by using the electron microscope (the evaluation device 112). In this example, the sectional shape so processed is described by using eight output parameters: (x1) a mask top width, (x2) a mask bottom width, (x3) a processed depth, (x4) a processed part top width, (x5) a processed part center width, (x6) a processed part bottom width, (x7) a processed part maximum width and (x8) a micro trench depth.

FIG. 5 is a table illustrating one example of goal output parameter values which are input into the input device 103 and goal values (the dimensions) of the eight output parameters illustrated in FIG. 4 are given. A goal shape that the eight goal output parameters indicate corresponds to a sectional shape of a vertical trench structure of, for example, 800 [nm] in width and 1000 [nm] in depth. In addition, also a weight which is used in calculation of the convergence is added to each output parameter. In this example, each weight is designated in such a manner that more importance is attached to accuracies of the output parameter values (x3 to x8) which describe the sectional shape so processed of an etching object than to accuracies of the output parameter values (x1 and x2) which describe the sectional shape so processed of a mask layer.

FIG. 6 is a table illustrating one example of maximum values and minimum values of input parameters of the etching device which are stored in advance in the database 105 and the input parameters are determined in accordance with the specification of the etching device used. In this example, use of seven input parameters, that is, a gas pressure, an electrical discharge power, a wafer-applied bias power and flow rates of various types of gases is possible. In addition, settable ranges of the respective input parameters are given as follows. That is, for example, a control range of the gas pressure is 1 to 10 [Pa], a control range of the electrical discharge power is 500 to 1000 [W], a control range of the bias power is 0 to 100 [W] and a control range of each gas flow rate is 0 to 200 [sccm].

FIG. 7 is a table illustrating a selection example of the input parameters to be controlled. In this example, the six input parameters except "Gas Type 4" are selected.

FIG. 8 is a table illustrating one example of the initial input parameter values (the initial processing conditions) which are set by the initial processing condition setting unit 106. The initial input parameter values in FIG. 8 are automatically set for the six input parameters (FIG. 7) that the user selects on the basis of the table (FIG. 6) which indicates the settable ranges of the respective input parameters. In a condition 1, values of three parameters, that is, the gas pressure, the electrical discharge power and the bias power are set to mean values within controllable ranges and values of the respective gas flow rates are set to be equally distributed in such a manner that the total flow rate reaches 200 [sccm]. Incidentally, the value 200 [scorn] is merely one example and the total flow rate may have an appropriate value which does not exceed an exhaustible upper limit value of the etching device. The values of the condition 1 are used as standard values of conditions 2 to 13. In the conditions 2 to 7, values of the gas pressure, the electrical discharge power and the bias power are set to be individually allocated to the maximum values and the minimum values respectively with the condition 1 being set as a standard. In the conditions 8 to 13, values are set to be individually allocated to the maximum values and the minimum values for the three gas flow rates and to be equally distributed for the remaining two gas flow rates with the condition 1 being set as the standard. In the thirteen conditions which are set in this way, the respective input parameters have not less than three levels (the maximum value, the minimum value and the mean value) and are in the form of combinations which are necessary to start searching-for of the optimal solution in a six-dimensional parameter space. Incidentally, setting of the input parameters by the user is also possible by using the orthogonal table depending on the number of the input parameters used, instead of automatic setting.

Figures 9, 10:
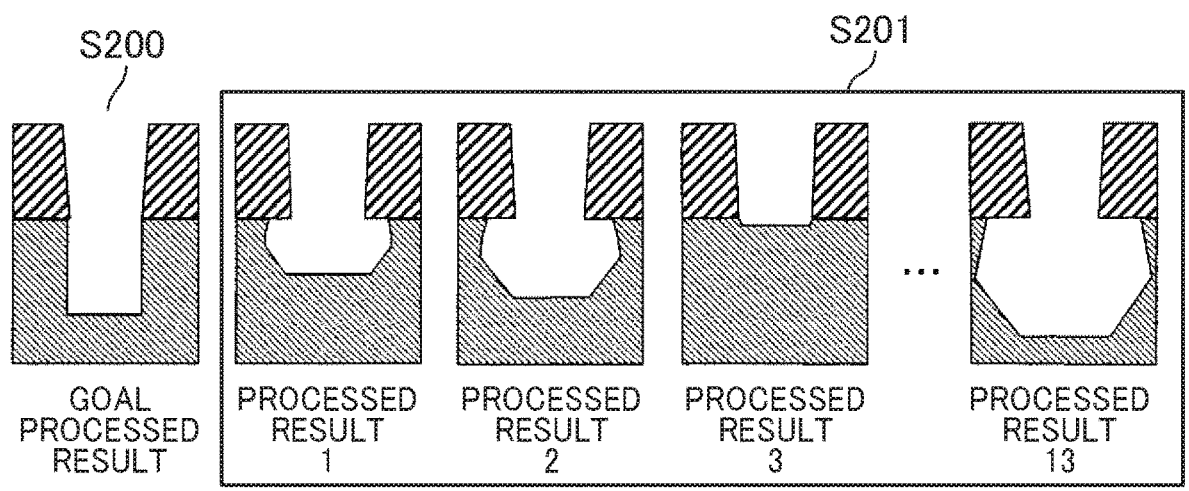
FIG. 9 is a table illustrating one example of output parameter values (initial processed results) obtained by performing processing under the initial processing conditions.
FIG. 10 is a diagram illustrating one example of processed shapes obtained by performing the processing under the initial processing conditions.

FIG. 9 is a table illustrating one example of the output parameter values (the actual values) (the initial processed results) which indicate a result of processing performed by the etching device in accordance with the initial processing conditions illustrated in FIG. 8. Sectional shapes (the initial processed results) obtained after processed under the initial processing conditions are acquired by using the electron microscope (the evaluation device 112). FIG. 10 is a diagram illustrating one example of data on the sectional shapes and respective initial processed results (processed shapes) which correspond to the respective initial processing conditions are illustrated (S201). In addition, also one example of a processed shape S200 (a goal processed result) which corresponds to the goal output parameter value is illustrated as a reference. Each set (thirteen sets in this example) of the initial input parameter values which are the initial processing conditions (FIG. 8)) and the corresponding initial output parameter values which are the initial processed results (FIG. 9)) configures the initial learning data.

FIG. 11 is tables illustrating one example of a transition of the output parameter values (the actual values) for a goal sectional shape and target sectional shapes when the estimation process of the present embodiment is executed repetitively ten times. In this example, four target sectional shapes are set for every round of the estimation process. FIG. 12 is diagrams illustrating one example of a result of execution of the estimation process illustrated in FIG. 11. In FIG. 12, solid lines indicate the goal sectional shape and the target sectional shapes which are set and broken lines indicate actual measurement results of processed sectional shapes which are obtained by performing the processing by the etching device on the basis of processing conditions (the input parameter values) which are estimated by using a prediction model which is obtained at that time for the output parameter values of the goal sectional shape and the target sectional shapes. Here, although it has been described before that in a case where the processing condition is to be searched for by using the prediction model in the estimation process, it is necessary to take the constraint conditions on the input parameters into consideration, in this example, for example, in a case where an upper limit value M is set to the total flow rate of the gases due to an exhaust capacity of the etching device used, it is necessary to limit an area to be searched by a constraint condition formula indicated in (Numerical Formula 2) when searching for the solution. Here, $F_i$ is a flow rate of an i-th gas and N is the total number of the types of gases used.

[Numerical Formula 2]

$$\Sigma_{i=1}^{N} F_i \leq M \quad (2)$$

In addition, in a case where the flow rates of all the gases are reduced to zeros, no etching occurs and therefore an area concerned is excluded from areas to be searched.

As illustrated in FIG. 12, in the first round of the estimation process, only thirteen pieces of initial leaning data are prepared as the learning data and the accuracy of the prediction model is low and, therefore, in sectional shapes which are obtained under the searched conditions, a difference between the goal sectional shape and the target sectional shapes is large. The accuracy of the prediction model is improved by repetitively performing estimation and learning and sectional shapes which are set within an error range are obtained in the tenth round of the estimation process.

The search device 100 models a relation between the input parameter value and the output parameter value of the processing device 111 and further automatically sets the target output parameter value (the target processed result) in order to search out the optimal input parameter value for achieving the goal output parameter value (the goal processed result) in this way. Then, the search device 100 updates the prediction model by using the results of processing by the processing device 111 and the evaluation device 112 as additional learning data. It is possible to autonomously search out a value of each input parameter with which the goal processed result is obtained and thereby to automatically elicit the performance of the processing device 111 by repetitively performing such an estimation process. Thereby, it is possible to promote improvement of search efficiency of the optimal solution relating to each input parameter of the processing device 111 and thereby to promote efficiency of the operation of the processing device 111 and optimization of the processing.

As a modified example of the first embodiment, it is also possible to load the function of the search device on a control device that a processing apparatus has. A schematic diagram of a plasma processing apparatus having an optimal processing condition search function is illustrated in FIG. 18 as one example of the processing apparatus. The plasma processing apparatus is equipped with a plasma generation antenna 56, and a radio frequency power source 51 and a first radio frequency matching device 52 which apply a radio frequency voltage to the plasma generation antenna 56. A first passage 61 and a second passage 62 are installed in order to introduce a plurality of types of gases into a processing chamber 60. Incidentally, in this example, although only two systems of the passages are illustrated in FIG. 18, there is no particular limitation to the number of passages to be installed. Plasma 63 which is inductively coupled from reactant particles is generated by acting a radio frequency alternate electromagnetic field which is generated on the antenna 56 on an introduced mixed gas. In addition, the plasma processing apparatus is equipped with a substrate voltage generator 54 and a second radio frequency matching device 53 configured to perform processing with the generated plasma 63. In addition, the plasma processing apparatus is equipped with an end-point decision device 55 which is able to monitor a fluctuation of the plasma which is generated when processing a substrate (a sample) 59 to be processed and has a function of feeding a signal obtained from the end-point decision device 55 back to a first mass flow controller 57 and a second mass flow controller 58. The first mass flow controller 57 is able to adjust the gas flow rate of the first passage 61 and the second mass flow controller 58 is able to adjust the gas flow rate of the second passage 62 in accordance with the signal from the end-point decision device 55.

A control device 70 of the plasma processing apparatus is able to execute plasma processing such as etching processing and so forth on the substrate 59 by controlling plasma generation devices such as the radio frequency power source 51, the substrate voltage generator 54, the end-point decision device 55 and so forth of the plasma processing apparatus and is able to execute the search processing which is described in the first embodiment by implementing a process program which corresponds to the search program which is stored in the ROM 117 (FIG. 2) of the search device 103 and is adapted to execute the search processing. In a case of executing the search processing, an input device 71 and an output device 72 of the plasma processing apparatus fulfill functions which correspond to the functions of the input device 103 and the output device 114 for data input/output into/from the search device 100 (FIG. 1) respectively. The search processing is incorporated as one function of the processing device 111 in this way, not installing the search device 100 independently of the processing device 111 and thereby it becomes possible to control the plasma processing apparatus and to execute the plasma processing on the basis of searched-out input parameter values of the respective parameters.

Second Embodiment

In the first embodiment of the present invention, the semiconductor manufacturing system 10 which includes the processing device 111 which processes the semiconductor or the semiconductor device which includes the semiconductor has been described by way of example. However, the system to which the search device and a searching method of the present invention are applicable is not limited to the semiconductor manufacturing system 10. As the second embodiment, an example that the search device and the searching method are applied to a synthesis device which executes synthesis processing on materials as processing will be described. Incidentally, the same symbol is assigned to a constitutional element having the function which is substantially the same as the function of the constitutional element in the first embodiment and detailed description thereof is omitted, and then description will be made with a focus on different parts.

Figures 13, 14, 15:
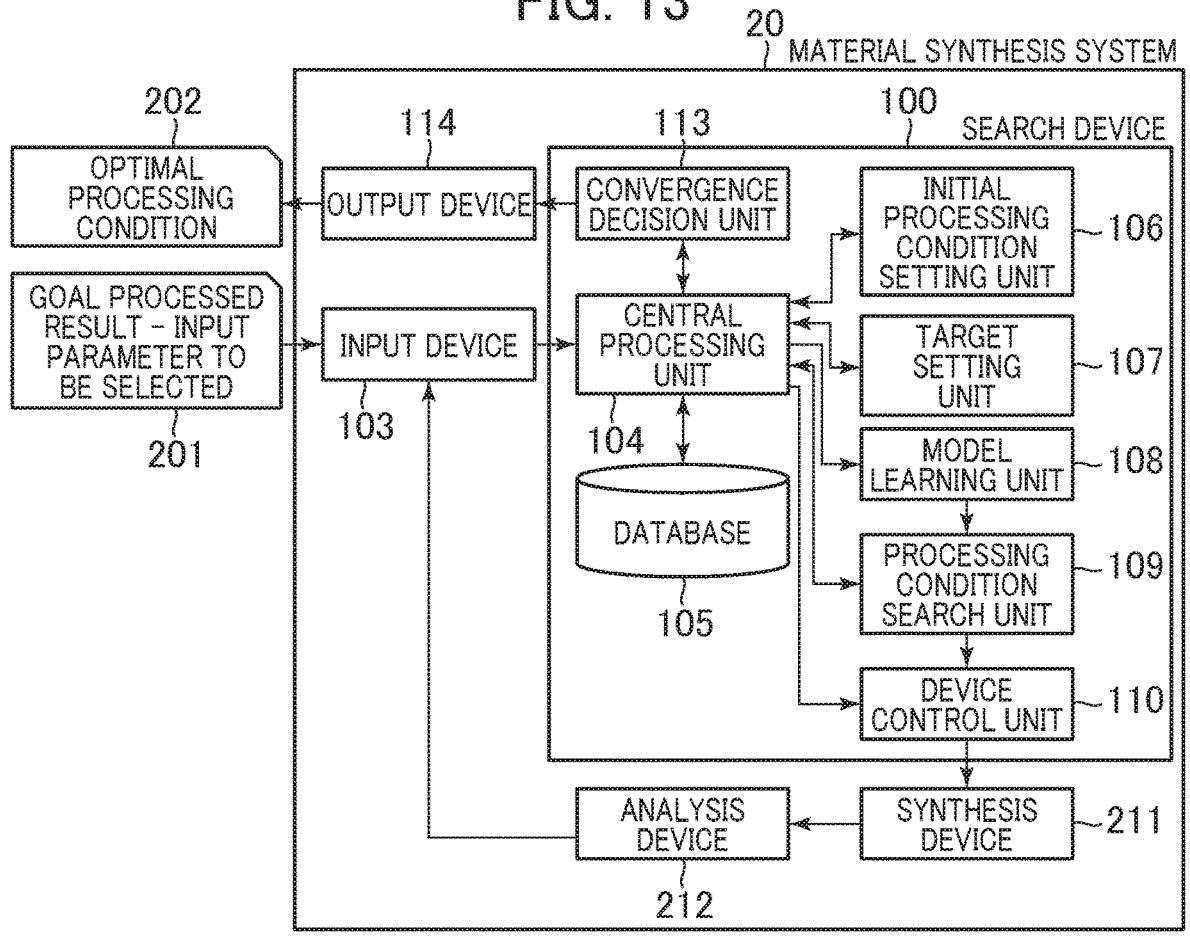
FIG. 13 is a diagram illustrating one system configuration example of a material synthesis system.
FIG. 14 is a table illustrating one example of goal output parameters.
FIG. 15 is a table illustrating one example of input parameter settable ranges.

FIG. 13 is a diagram illustrating one system configuration example of a material synthesis system 20. The material synthesis system 20 has the search device 100, the input device 103, the output device 114, a synthesis device 211 and an analysis device 212.

The synthesis device 211 is a device which synthesizes various materials such as magnetic materials, polymeric materials, medicines and so forth. The synthesis device 211 synthesizes materials on the basis of the processing conditions (the input parameter values of the respective parameters) which are input from the search device 100 and transfers a synthesized substance to the analysis device 212. The analysis device 212 performs analysis for evaluation of the substance which is synthesized by the synthesis device 211 and acquires material characteristic data (the output parameter values of the respective parameters). The analysis device 212 may be configured by a plurality of devices installed for every material characteristic to be measured.

Incidentally, in a case where it is possible to predict the material characteristics of the synthesized substance with high accuracy by material calculations using a computer, it is also possible to replace the synthesis device 211 and the analysis device 212 with the computer.

Also, in the second embodiment, the search processing for the optimal processing conditions is executed following the flowchart in FIG. 3. The goal processed results are given as goal material characteristics (the goal output parameter values) which indicate the characteristics of the substance that the synthesis device 211 synthesizes.

FIG. 14 is a table illustrating one example of output parameters which are used for designation of the goal material characteristics to be input into the input device 103, that is, the example that the material characteristics of the synthesized substance are acquired by using the various analysis devices. In this example, the material characteristics are described by using six parameters. In this example, (1) a melting point, (2) a boiling point, (3) a density, (4) a thermal conductivity, (5) an electric conductivity and (6) a bulk modulus are used as the output parameters. Use of characteristics such as saturation magnetization, coercive force, magnetic anisotropy, a Curie temperature and so forth is also possible for a magnetic material in addition to the above-described characteristics. In addition, also the weight is given to each output parameter. The weight is used in calculation of the convergence. In this example, a search that more importance is attached to the accuracy of the bulk modulus than to other output parameters is designated.

FIG. 15 is a table illustrating one example of maximum values and minimum values of input parameters of the synthesis device 211 which are stored in advance in the database 105. The input parameters are determined depending on the specification of the synthesis device used. In this example, use of seven input parameters is possible. That is, a reaction temperature, a reaction time, a stirring frequency and ratios of respective kinds of materials are used. In addition, settable ranges of the respective parameters are given as follows. That is, for example, a control range of the reaction temperature is 30 to 100[° C.], a control range of the reaction time is 1 to 10 [hour], a control range of the stirring frequency is 100 to 1000 [rpm] and a control range of each material ratio is 0 to 100 [%].

FIG. 16 is a table illustrating one example of selection of input parameters to be controlled. In this example, the six input parameters except the ratio of the material 4 are selected.

FIG. 17 is a table illustrating one example of the initial input parameter values (the initial processing conditions) set by the initial processing condition setting unit 106. The initial input parameter values are automatically set for the six input parameters (FIG. 16) that the user selects on the basis of the table (FIG. 15) which indicates the input parameter settable ranges. In a condition 1, values of the three parameters, that is, the reaction temperature, the reaction time and the stirring frequency are set to mean values within the controllable ranges and values of the material ratios are set to be equally distributed in such a manner that the total ratio reaches 100 [%]. The values of the condition 1 are used as standard values of conditions 2 to 13. In the conditions 2 to 7, values of the reaction temperature, the reaction time and the stirring frequency are set to be individually allocated to the maximum values and the minimum values with the condition 1 being set as a standard. In the conditions 8 to 13, values are set to be individually allocated to the maximum values and the minimum values for the three material rates and to be equally distributed for the remaining two material ratios with the condition 1 being set as the standard.

Whether each material characteristic (the output parameter value) of the substance that the synthesis device 211 synthesizes converges to each goal material characteristic (the goal output parameter value) is decided by the convergence decision unit 113 (step S103 and step S109 in FIG. 3). A square sum of errors between the respective output parameter values and the respective goal output parameter values relating to all the output parameters used which is given by (Numerical Formula 3) is used in decision of a degree of matching between the output parameter value and the goal output parameter value of each parameter. At that time, since the dimensions of the respective output parameters are different from each other, standardization is performed and then error calculation is performed. The standardization means conversion into data having zero mean and unit variance by subtracting the mean of the whole data from each data and dividing an obtained value by a standard deviation of the whole data.

[Numerical Formula 3]

$$\Sigma_{i=1}^{NP}(z_i - t_i)^2 \cdot W_i \tag{3}$$

Here, NP is the total number of the output parameters used, $z_i$ is an i-th goal output parameter value obtained after standardization, $t_i$ is an i-th output parameter value (the actual value) obtained after standardization and $W_i$ is the weight that the user designates for every output parameter.

In addition, in each estimation process, the target setting unit 107 sets the target material characteristic of each characteristic which corresponds to the target processed result in the first embodiment (step S105 in FIG. 3). The target setting unit 107 selects the best characteristic value (the output parameter value (the actual value)) which is the closest to the goal material characteristic from the existing learning data and sets the target material characteristic (the target output parameter value) which is acquired at an intermediate stage of acquisition of values ranging from the best output parameter value to the goal output parameter value. The target setting unit 107 sets the target output parameter value by interpolating values between the best output parameter value and the goal output parameter value similarly to the process in the first embodiment.

In addition, the processing condition search unit 109 searches for the processing conditions for giving the goal output parameter value and the target output parameter value by using the prediction model which is transferred from the model learning unit 108 and the constraint condition on each input parameter which is read out of the database 105 (step S107 in FIG. 3).

As the constraint condition on each input parameter in the second embodiment, it is inevitable to set the total of the material ratios to 100 [%] and therefore when the number of materials which are designated is denoted by N, an independent variable is N−1. Now, when the ratio of the i-th material is denoted by $R_i$, a constraint condition expressed by (Numerical Formula 4) is imposed on a ratio $R_N$ of an N-th material.

[Numerical Formula 4]

$$R_N = 100 - \Sigma_{i=1}^{N-1} R_i \quad (4)$$

Further, in a case of searching for Ri (i≠N) as a parameter, it is impossible to individually take optional values up to the maximum value and a constraint condition which is expressed by (Numerical Formula 5) is imposed.

[Numerical Formula 5]

$$\Sigma_{i=1}^{N-1} R_i \leq 100 \quad (5)$$

Accordingly, in a case of designating N materials in total, the number of the parameters of the material ratios to be searched amounts to (N−1), (Numerical Formula 5) which is the constraint condition is taken into consideration when searching for the solution and thereafter the ratio of the material N is determined by using (Numerical Formula 4).

The search device 100 models a relation between the input parameter value and the output parameter value of the synthesis device 211 and further automatically sets the target output parameter value (the target material characteristic) in order to search out the optimal input parameter value for achieving the goal output parameter value (the goal processed result) in this way. Then, the search device 100 updates the prediction model by using the results of processing by the synthesis device 211 and the analysis device 212 as additional learning data. It is possible to autonomously search out a value of each input parameter with which the goal material characteristic is obtained by repetitively performing such an estimation process and thereby to automatically elicit the performance of the synthesis device 211. Thereby, it is possible to promote improvement of efficiency of searching-out of the optimal solution relating to each input parameter of the synthesis device 211 and thereby to promote efficiency of the operation of the synthesis device 211 and optimization of the processing.

Incidentally, the present invention is not limited to the aforementioned embodiments and various modified examples and equivalent configurations in the gist of the appended patent claims are included. For example, the aforementioned embodiments are described in detail for easy understanding of the present invention and the present invention is not necessarily limited to the one which includes all the configurations which are described. In addition, part of a configuration of one embodiment may be replaced with a configuration of another embodiment. In addition, a configuration of another embodiment may be added to a configuration of one embodiment. In addition, another configuration may be added to, deleted from and/or replaced with part of one configuration of each embodiment.

In addition, the aforementioned respective configurations, functions, processing units, processing measures and so forth may be implemented in hardware by designing some or all of them by using, for example, an integrated circuit and so forth and may be implemented in software by interpreting and executing a program for implementing each function thereof by a processor. It is possible to store information on the program, the table, a file and so forth used for implementing each function in a storage device such as a memory, a hard disc, an SSD (Solid State Drive) and so forth and/or a recording medium such as an IC (Integrated Circuit) card, an SD (Secure Digital) card, a DVD (Digital Versatile Disc) and so forth.

In addition, only control lines and communication lines which are thought to be necessary from the viewpoint of description are illustrated and all control lines and communication lines which are necessary from the viewpoint of mounting are not necessarily illustrated. Practically, it may be thought that almost all configurations are mutually connected.

What is claimed is:

1. A search device which searches an input parameter value of each control parameter of a processing apparatus which corresponds to a goal output parameter value to be given to the processing apparatus, the search device comprising:

a processor; and a memory, wherein the memory comprises a sequence of programmed instructions for a search program which, when executed by the processor, causes the processor to search for the input parameter value which corresponds to a goal, wherein the processor is configured to build a prediction model from learning data which is sets containing a plurality of the input parameter value of the processing apparatus and output parameter values which are results of a processing that the processing apparatus performs on the basis of the input parameter values;

set a target output parameter value by interpolating values between the goal output parameter value and an output parameter value which is selected from the output parameter values and is closest to the goal output parameter value;

estimate input parameter values which correspond to the goal output parameter value and the target output parameter value; and decide whether the output parameter value which is the result of the processing that the processing apparatus performs on the basis of the input parameter value converges to the goal output parameter value in a predetermined range, wherein the input parameter value for which convergence is decided is output as the input parameter value which corresponds to the goal output parameter value, wherein the processor is further configured to transfer the estimated input parameter value which corresponds to the goal output parameter value as an optimal processing condition to the processing apparatus via an output device, and wherein the processing apparatus is an apparatus which processes a semiconductor based on the optimal processing condition received from the processor, or an apparatus which processes a semiconductor device which includes the semiconductor or a synthesis device which synthesizes materials based on the optimal processing condition received from the processor.

2. The search device according to claim 1, wherein a table indicating settable ranges of input parameter values is stored in the memory, and wherein the processor is further configured to set a plurality of initial input parameter values in such a manner that each of the input parameter values used in the prediction model includes three values on the basis of the table; and build the prediction model by using each set of the initial input parameter value and an initial output parameter value which is a result of processing that the processing apparatus performs on the basis of the initial input parameter value as initial learning data.

3. The search device according to claim 2, wherein the three values are a maximum value, a minimum value, and a mean value.

4. The search device according to claim 1, wherein the processor further is configured to set a plurality of the target output parameter value between the goal output parameter value and the output parameter value which is the closest to the goal output parameter value.

5. The search device according to claim 1, wherein convergence/non-convergence is decided on the basis of an error between the goal output parameter value and the output parameter value and a weight which is given to a goal output parameter concerned.

* * * * *